United States Patent [19]
Nute

[11] Patent Number: 5,862,014
[45] Date of Patent: *Jan. 19, 1999

[54] MULTI-CHANNEL MAGNETIC TAPE HEAD MODULE INCLUDING FLEX CIRCUIT

[75] Inventor: Robert A. Nute, Westboro, Mass.

[73] Assignee: Quantum Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 587,425

[22] Filed: Jan. 11, 1996

[51] Int. Cl.$^6$ ............................... G11B 5/48; G11B 5/54
[52] U.S. Cl. ......................... 360/104; 360/106; 360/108
[58] Field of Search .................................. 360/96.1, 104, 360/106, 108, 109, 93, 95, 77.12, 77.13, 78.02

[56] References Cited

U.S. PATENT DOCUMENTS

| | | | |
|---|---|---|---|
| 4,599,666 | 7/1986 | Liu et al. | 360/106 |
| 4,811,165 | 3/1989 | Currier et al. | 361/386 |
| 5,051,366 | 9/1991 | Anderson et al. | 436/67 |
| 5,055,969 | 10/1991 | Putnam | 361/398 |
| 5,095,396 | 3/1992 | Putnam et al. | 360/106 |
| 5,134,252 | 7/1992 | Himeno et al. | 174/268 |
| 5,371,636 | 12/1994 | Nayak et al. | 360/78.02 |
| 5,371,638 | 12/1994 | Saliba | 360/77.12 |
| 5,426,549 | 6/1995 | Sakai | 360/106 |
| 5,448,438 | 9/1995 | Kasetty | 360/106 |
| 5,508,860 | 4/1996 | Takagi et al. | 360/97.01 |

FOREIGN PATENT DOCUMENTS 2212971  8/1989  United Kingdom ................... 360/106

OTHER PUBLICATIONS

U.S. Patent Application Serial No. 08/577,662 by Kasetty, entitled: "Head Tilting Mechanism for Tape Drives".

*Primary Examiner*—Craig A. Renner
*Attorney, Agent, or Firm*—David B. Harrison; Nydegger & Associates; Debra A. Chun

[57] ABSTRACT

A flex circuit for a tape drive includes an elongated flexible printed circuit substrate carrying a pattern of electrical circuit interconnections and divided into a read channel portion for direct connection to multiple read and write heads of a tape head array and carrying a plurality of read channel preamplifiers connected to receive and amplify read signals from a plurality of read heads; a write channel portion including an external connection region for enabling signal and power connections to be made with a host circuit module, the write channel portion including a plurality of write channel drivers; and, a dynamic flexing portion separating and interconnecting the read channel portion and the write channel portion, the dynamic flexing portion adjusting in contour as positional adjustments are made to the head array by a head positioning mechanism. As a related aspect, the flex circuit is secured to a head mounting plate which secures the tape head array, thereby forming a stand-alone multi-track tape head module.

14 Claims, 7 Drawing Sheets

MULTI-CHANNEL MAGNETIC TAPE HEAD MODULE INCLUDING FLEX CIRCUIT

FIELD OF THE INVENTION

The present invention relates to flex circuits for magnetic recording heads. More particularly, the present invention relates to a flex circuit head module providing electronic signal paths between a positionable tape head array and a main circuit module of a digital linear tape drive.

BACKGROUND OF THE INVENTION

Tape recording and reproducing systems for use as computer data storage devices are required to provide increasingly high data transfer rates and to perform a read verification upon all data being written to tape. Streaming tape drives are so named because multiple blocks of user data are typically written to tape in a single streaming operation, rather than as a series of start-stop operations. Digital linear tape drives are an improved species of streaming tape drives.

In order to increase data density in streaming tape drive systems, track widths are decreasing, while data transfer rates are increasing. It is practical to provide e.g. approximately 128 linear data tracks within a one-half inch wide tape with current technology. One way to increase track densities is to employ azimuth recording techniques in which the tape head structure is canted at a particular offset angle relative to longitude and direction of travel of the tape. At the same time, the digital linear tape drive should be backwardly compatible with tapes which may have been recorded with conventional longitudinal recording techniques. Azimuth recording technology, together with a continuing requirement for backward compatibility, has resulted in tape head structures which include a higher number of write elements, and has required a more complex head positioning mechanism which provides both transverse (up and down) as well as azimuth angle positioning of the tape head structure.

With a relatively high number of narrow-width data tracks, great care must be taken in accurately positioning the tape head structure and in providing efficient electronics for amplifying signals read back by read elements from the tape, and for driving write head elements with signals to be written to the tape. Also, interconnecting read and write data signals between a tape head array and associated electronics poses several concerns. These concerns include susceptibility to electrical noise and crosstalk between channels, parasitic capacitance and inductance, mechanical forces unwantedly applied to the head positioning mechanism, cabling and manufacturing costs, head maintenance and upgrades, and availability of circuit board space.

Flex circuits have been used in the mass storage art to provide flexible electrical connections to magnetic recording/playback heads. Flex circuits have been frequently employed in hard disk drives to provide flexible circuit connections, as well as a mounting substrate for carrying discrete and integrated electronics circuitry in order to position playback preamplifier circuitry close to the read head elements in order to improve signal to noise ratios. One example of a flex circuit for a hard disk drive employing a rotary voice coil head positioner is given in U.S. Pat. No. 5,055,969 to Putnam, entitled: "Servo/Data Actuator Arm Flexible Circuit", the disclosure being incorporated herein by reference.

Flexible substrates providing flexible circuit paths have also been proposed for use with tape recording systems. Examples include U.S. Pat. No. 5,134,252 to Himeno et al., entitled: "Signal Line", and U.S. Pat. No. 5,051,366 to Anderson et al, entitled: Electrical Connector". The Himeno et al. patent describes a flexible circuit carrying magnetically shielded signal paths between a rotary head drum of a digital audio tape recorder and external read preamplifier/write driver circuitry. The Anderson et al. patent describes a connector mechanism for interconnecting flexible circuits of a tape head module to flexible circuits extending from separate read and write circuit cards of e.g. an IBM 3490 Tape Drive. While these patents suggest the use of flexible circuits within tape drives, they do not overcome or suggest any solutions to a number of serious problems confronting streaming tape drives for azimuth as well as longitudinal recording, achieved with a multi-dimension positionable head structure.

SUMMARY OF THE INVENTION WITH OBJECTS

One object of the present invention is to improve performance of read preamplifier and write driver circuitry by reducing capacitance, by increasing resonance and data speed, and by reducing electrical noise with a flex circuit overcoming limitations and drawbacks of prior approaches.

Another object of the present invention is to provide a flex circuit which is transparent to a main circuit module, thereby enabling design flexibility over prior approaches, including performance improvement changes, cost reduction changes, and a number of versions for different types of heads whether ferrite core, thin film or magnetoresistive.

A further object of the present invention is to provide a flex circuit arrangement which may readily be improved and evolved to greater levels of circuit integration in order to improve performance, and to reduce costs and space requirements in a manner overcoming limitations of prior approaches.

One more object of the present invention is to reduce and make more uniform and controllable certain external forces applied to the head positioning mechanism by head structure circuit connections and thereby achieve an improved alternative to cables, which, in one embodiment disclosed hereinafter would otherwise comprise at least twelve shielded twisted wire triplets.

Yet another object of the present invention is to provide a complete, separately testable read preamplifier/write driver module upon a flex circuit for a tape drive in a manner enabling reduction of overall drive manufacturing and maintenance costs.

Still one more object of the present invention is to free up real estate on main circuit module for other circuit elements by providing a stand-alone flex circuit subassembly carrying connections to a head structure of a streaming tape drive and read preamplifier and write driver circuitry in a manner overcoming limitations and drawbacks of prior approaches.

Yet one more object of the present invention is to provide a flex circuit for a multi-track tape head module that does not require any special magnetic or electrostatic shielding.

In one aspect of the present invention, a flex circuit for a tape drive includes an elongated flexible printed circuit substrate carrying a pattern of electrical circuit interconnections and divided into three portions; namely, a read channel portion for direct connection to multiple read and write heads of a tape head array and carrying a plurality of read channel preamplifiers connected to receive read signals from a plurality of read heads; a write channel portion including an external connection region for enabling signal and power connections to be made with a host circuit module, the write channel portion including a plurality of write channel drivers for driving the write heads, and a dynamic flexing portion separating and interconnecting the read channel portion and the write channel portion, the dynamic flexing portion adjusting in contour as positional adjustments are made to the head array.

Within this aspect of the present invention, the flex circuit may further include head selection logic circuitry for selecting and enabling particular ones of the write heads in accordance with positional adjustments made to the head array and in accordance with a direction of tape movement during operations of the tape drive. Also, the flex circuit may include a mechanical reinforcement layer for mechanically stiffening and reinforcing the read channel portion and the write channel portion, thereby controlling flexure mechanics within the dynamic flexing portion.

In a related aspect of the present invention, a multi-track magnetic tape head assembly for a tape drive includes a head mounting plate, a head array secured to the head mounting plate and defining a plurality of write heads and a plurality of read heads, and an elongated flex circuit. The flex circuit has a first end attached to the head mounting plate and connected to the write and read heads. A second end of the flex circuit defines a connection region for connection of power, data, and control signals from and to a main electronics circuit module of the tape drive. The flex circuit is divided into a read channel portion for direct connection to multiple read and write heads of the head array and for carrying a plurality of read channel preamplifiers connected to receive and amplify read signals from a plurality of read heads, a write channel portion including the second end connection region and including a plurality of write channel drivers for driving write heads in accordance with data signals to be written to a recording tape, and a dynamic flexing portion separating and interconnecting the read channel portion and the write channel portion, the dynamic flexing portion adjusting in contour as positional adjustments are made to the head array relative to a base of the tape drive.

In this aspect of the invention the flex circuit may further comprise head selection logic circuitry for selecting and enabling particular ones of the write heads in accordance with positional adjustments made to the head array and in accordance with a direction of tape movement.

In yet a further related aspect of the present invention, a magnetic tape drive includes a base and a tape take-up reel and cartridge receiver for receiving and engaging a single supply reel tape cartridge. The tape drive also includes a multi-track magnetic head array having a plurality of forward direction write elements located on one side of the array, a plurality of reverse direction write elements located on another side of the array, and a plurality of read elements located centrally between the forward direction write elements and the reverse direction write elements. The head array is secured to a head mounting plate, and an elongated flex circuit has a first end attached to the head mounting plate and connected to the write and read heads, and has a second end defining a connection region for connection to a main electronics circuit module of the tape drive. The flex circuit is divided into a read channel portion for direct connection to the plurality of read elements and write elements of the head array and carries a plurality of read channel preamplifiers connected to receive read signals from a plurality of read elements, a write channel portion including the external connection region and a plurality of write channel drivers connected to drive the plurality of write elements, and a dynamic flexing portion separating and interconnecting the read channel portion and the write channel portion, the dynamic flexing portion adjusting in contour as positional adjustments are made to the head array relative to a base of the tape drive; and, a head positioning mechanism secured to the base including a receiver for receiving the head mounting plate in a predetermined relationship, for positioning the head array in at least a dimension substantially perpendicular to a major plane of the base.

In this aspect of the invention the head positioning mechanism may be adapted to position the head array at plural predetermined azimuth angles as well as in the perpendicular dimension. Also in this aspect of the invention the dynamic flexing portion separating and interconnecting the read channel portion and the write channel portion may follow a generally U-shape contour therebetween when the flex circuit is installed between the head plate and the main electronics circuit module of the tape drive.

These and other objects, aspects, advantages and features of the present invention will be more fully understood and appreciated upon consideration of the accompanying drawings in accordance with the following detailed description thereof.

DETAILED DESCRIPTION OF A PREFERRED EMBODIMENT

Figure 1:
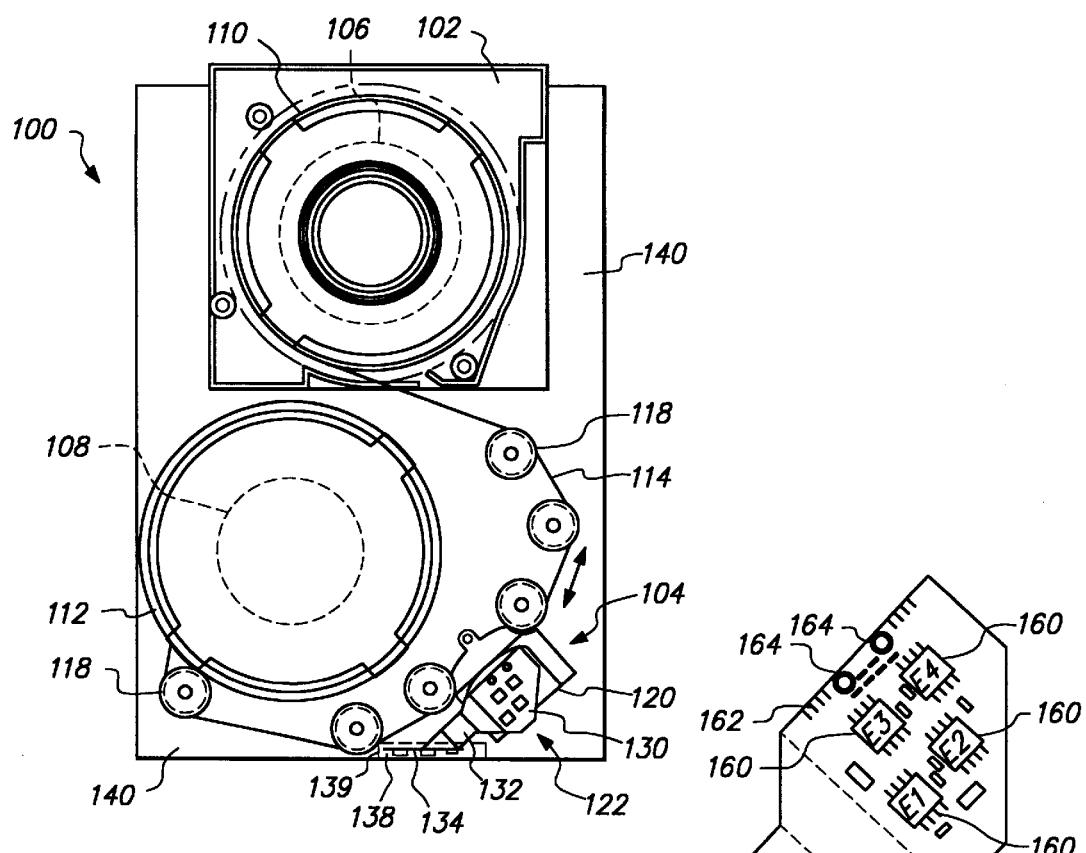
FIG. 1 is a diagrammatic plan view of a digital linear tape drive including a flex circuit for connecting the read and write head array in accordance with principles of the present invention.
Figure 3:
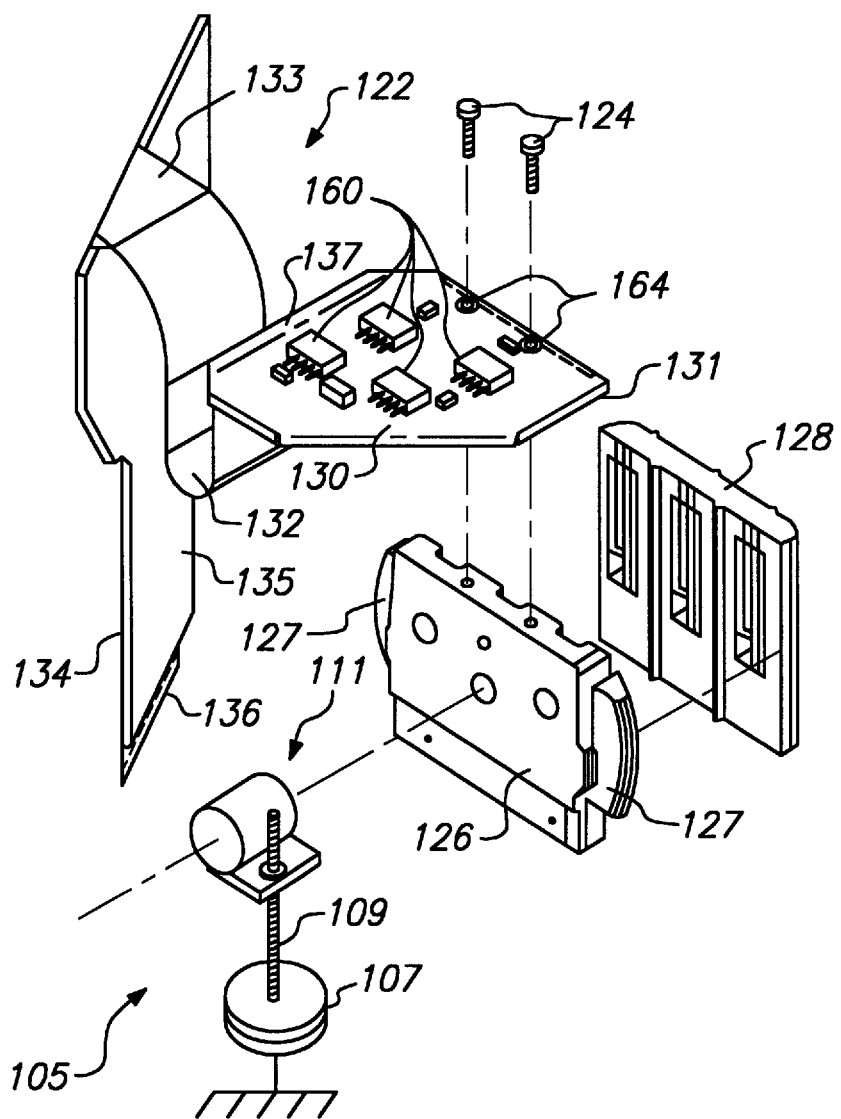
FIG. 3 is an exploded diagrammatic view of the FIG. 2 flex circuit as formed with selective structural reinforcing layers to follow a desired operational orientation relative to a head array and plate structure of the FIG. 1 tape drive.

FIG. 1 illustrates a digital linear tape drive 100 for receiving a single-reel tape cartridge 102. The tape drive 100 includes a multi-dimensional tape head actuator 104 for providing elevation and azimuthal adjustments to a magnetic read/write head structure 120. As shown in FIG. 3, the tape head actuator 104 includes an elevation mechanism 105 comprising e.g. a stepper motor 107 and lead screw 109, and an azimuth angle rotary adjustment mechanism 111 positioned by the elevation mechanism 105. The elevation mechanism 105 may be substantially in accordance with commonly assigned U.S. Pat. No. 5,448,438 to Kasetty, entitled: "Head Actuator Having Spring Loaded Split Nut";

and the azimuth mechanism 111 may be substantially in accordance with commonly assigned U.S. patent application Ser. No. 08/557,662 by Kasetty, filed on Nov. 13, 1995, and entitled: "Head Tilting Mechanism for Tape Drives", the disclosures thereof being incorporated herein by reference.

As shown in FIG. 1 the tape drive 100 includes tape reel drive motors 106 and 108 (indicated in dashed outlines and lead lines) arranged to rotate supply reel 110 and internal take-up reel 112, respectively, to advance magnetic tape 114 back and forth across the head structure 120. The tape drive 100 also includes tape guide rollers 118 that define a generally arcuate tape path between reels 110 and 112 along which tape 114 travels as it moves across the magnetic head structure 120. The tape head actuator 104 operates upon commands decoded within the drive 100 to position the magnetic head structure 120 laterally for track selection, and angularly for azimuth angle recording and playback relative to the tape 114 during operation of the drive 100.

Figure 4:
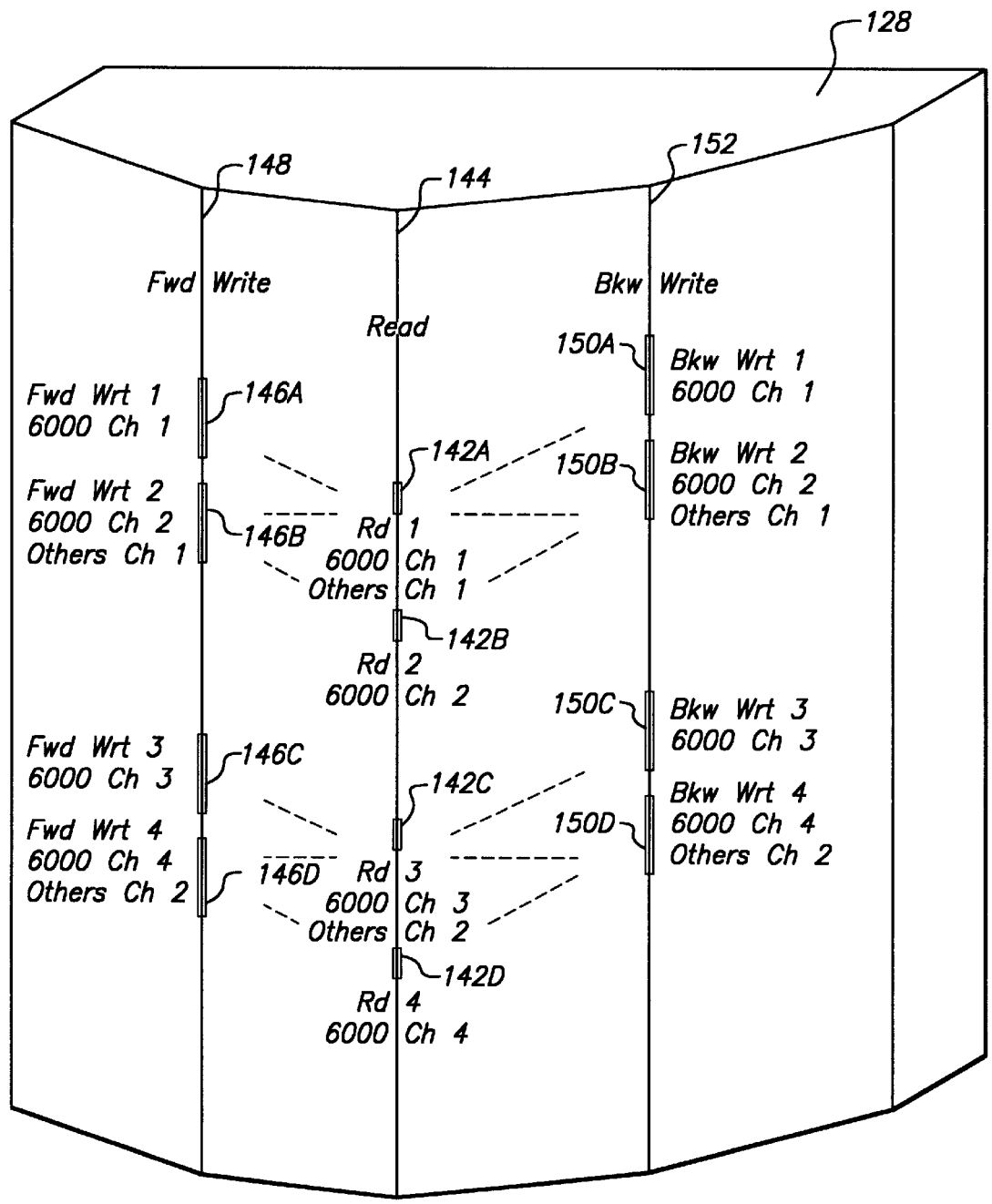
FIG. 4 is an enlarged view of a face of the tape head array shown in FIG. 3.

In accordance with aspects of the present invention, a flex circuit 122 is attached by two screws 124 to a head plate 126 of the head structure 120, the head plate 126 for mounting and aligning a read/write head array 128, shown in greater detail in FIG. 4. The head plate 126 is positioned by the elevation mechanism 105 and by the azimuth adjustment mechanism 111, and thereby positions the head array 128 in elevation (laterally) and angularly relative to the tape 114. The head array 128 is affixed to the head plate 126 by a suitable adhesive upon being precisely aligned thereto during assembly.

Figure 2:
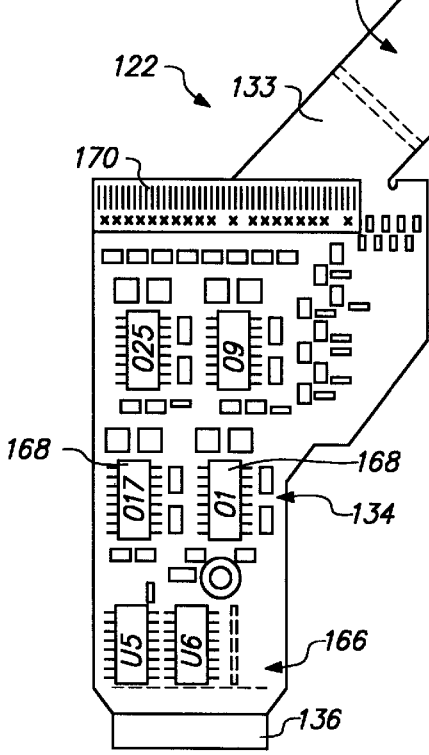
FIG. 2 is a diagrammatic flat planar view of the head connection flex circuit shown in FIG. 1 omitting reinforcing layers which contour the flex circuit for installation and use in the FIG. 1 tape drive.

The flex circuit 122 includes three major structural and functional portions, a read channel portion 130, a dynamic flexibility portion 132, and a main head select/write channel portion 134. The read channel portion 130 is mounted directly adjacent to the head array 128 in order to minimize conductor lengths to read heads and to minimize capacitance, inductance and pickup of extraneous noise. The main head select/write channel portion 134 includes an edge connection region 136 which enables a direct connection to a tape drive main circuit board 138 mounted below a base 140 via a zero insertion force (ZIF) connector. As shown in FIG. 1 the edge connection region 136 extends through a narrow slot 139 defined in a wall of the base 140. FIG. 2 illustrates the flex circuit 122 in a layout or plan view, while FIG. 3 illustrates the flex circuit 122 in a reinforced, operational position relative to the head plate 126 and head array 128.

The head array 128 includes e.g. four relatively narrow read heads 142A, 142B, 142C and 142D which are spaced apart along a center transverse contour 144 of the head array 128. In this example, there are four read channels: channels 1, 2, 3, and 4. The head array also includes e.g. eight relatively wide write heads, with four write heads 146A, 146B, 146C and 146D located along a left transverse contour 148, and four write heads 150A, 150B, 150C, and 150D, located along a right transverse contour 152. The write heads 146A–D write data to tape traveling in a forward direction from the supply reel 110 to the take-up reel 112, and the write heads 150A–D write data to tape traveling in a reverse or backward direction from the take-up reel 112 to the supply reel 110. In either direction of travel, the read heads 142A–D follow the selected write heads and thereby enable a read-after-write verification of data streamed to tape 114. In an azimuthal mode of operation the head 128 is tilted to a predetermined azimuth angle relative to the tape, and, depending on direction of tape travel, four write heads 146 or 150 and the four read heads 142A–D are active. In the azimuth mode, four tracks are simultaneously written and read during a single transport of the tape 114 past the head array 128.

For backward compatibility with tapes previously written in a non-azimuth, conventional longitudinal format, the head array 128 is oriented in a perpendicular alignment with the tape 114, and two write heads 146B and 146D, or heads 150B and 150D are active, and two read heads 142A and 142C are also active, so that two tracks may be written and read after write in accordance with the longitudinal format. Thus, the head array 128 requires a maximum of four active write channels and four active read channels during azimuthal operations. The head array 128 may be fabricated in accordance with commonly assigned U.S. Pat. No. 5,475,553 to Saliba, entitled: "Tape Head with Self-Regulating Wear Regions"; and, in accordance with commonly assigned U.S. patent application Ser. No. 08/507,618 by Saliba, filed on Jul. 26, 1995, entitled: "Method and Apparatus for Multiple Channel Head", the disclosures thereof being incorporated herein by reference.

The flex circuit 122 provides e.g. four write driver channels feeding the 8 write elements 146A–D and 150A–D, and four read channels receiving signals from the four read elements 142A–D, as well a certain digital logic elements for head select in accordance with tape direction and azimuthal/longitudinal tape format. The read channel region 130 includes four single channel read preamplifier integrated circuits 160 and associated discrete components as well as an edge connection region 162 enabling short, direct signal connections to e.g. minute head wires leading from the read heads 142A–D, as well as connections to e.g. minute head wires of the write heads 146A–D and 150A–D. Alternatively, suitable bridge connections may be formed between circuit traces defined on the head array 128 and aligned circuit traces of the connection region 162. Two pass-through openings 164 enable the screws 124 to pass through the flexible plastic film substrate of the flex circuit 122 and into threaded openings of the head plate 126 as shown in FIG. 3. At least one of the openings 164 includes a grounding signal trace which cooperates with one of the screws 124 to facilitate a signal ground point for the flex circuit to the conductive metal head plate 126.

The flexible dynamic portion 132 of the flex circuit 122 manifests a general U-shape following installation and during operation, as the head plate 126 moves up and down during track selection positioning operations of the elevational adjustment assembly 105, and from side to side during azimuth angle positioning operations of the azimuth angle control mechanism 111. The flexible dynamic portion 132, while being made of very flexible plastic film material, carries a multiplicity of signal and power connection paths between the read channel portion 130 and the main write channel portion 134. These paths include both write and read signal paths. The flexible dynamic portion 132 should be able to withstand at least one million flexural cycles before breakdown or failure.

In order to control precisely the application of bias force to the overall head structure 104, and to prevent the flex circuit 122 from being damaged by repeated head positioning operational cycles, the read channel portion 130 and including a generally trapezoidal segment 137 extending therefrom, and the main write channel portion 134 and including an angular segment 133, extend to both ends of the dynamic flex portion 132 and comprise a suitable integral backing substrate, such as a built-up laminar construction having a thin sheet aluminum alloy core. FIG. 3 illustrates a reinforcement layer 131 for the read channel portion 130 and segment 137, and a reinforcement layer 135 for the main write channel portion 134 and segment 133. The laminar construction may include alternating layers of thin (e.g. 1 mil thickness) polyimide plastic film (Kapton™), adhesive, copper circuit traces, plastic film insulation layer, and the aluminum core which provides desired rigidity to the reinforced portions 130 and 134. As formed, the flex circuit 122 follows a two layer etched circuit pattern design. Reinforcement of the portions 130 and 134 ensures that only the flexible dynamic portion 134 actually flexes, and that it flexes in a known, controlled manner in response to head positioning movements of the head positioner 104. Also, reinforcement of the portions 130 and 134 provides protection of the electronics circuit elements during handling of the flex circuit 122 incident to installation into, or removal from, the tape drive 100.

The main head select/write channel portion 134 comprises a combination of discrete and integrated electronics circuit elements including digital selection logic elements 166 and write current sources 168. A bar-coded sticker 170 may be affixed along an upper edge of the main portion 134 to facilitate head/flex circuit subsystem assembly, test and tracking.

It will be appreciated upon consideration of FIG. 3, that the head plate 126 includes two side tabs 127 which enable precise registration with a receiver structure of the bi-dimensional head adjustment mechanism 104, thereby facilitating removal and replacement of the head plate 126, head array 128, and flex circuit 122 as a single modular unit. One important aspect of the present invention is that the flex circuit 122 may be fully assembled, checked out, connected to the head array 128 and tested as a completed head/front end electronics subassembly before being installed in the tape drive 100, thereby ensuring operability and increasing reliability and quality of the completed tape drive. Also, because the flex circuit 122 carries all of the "front end" read/write channel electronics, it, with the head plate 126 and head array 128, may be readily replaced and/or upgraded as a unitary module. In this manner, the head subassembly of the tape drive may be changed or replaced, depending upon head wear, or the desire to upgrade the head array 128 to accommodate future tape formats, emergent tape head technologies, etc.

Figure 5:
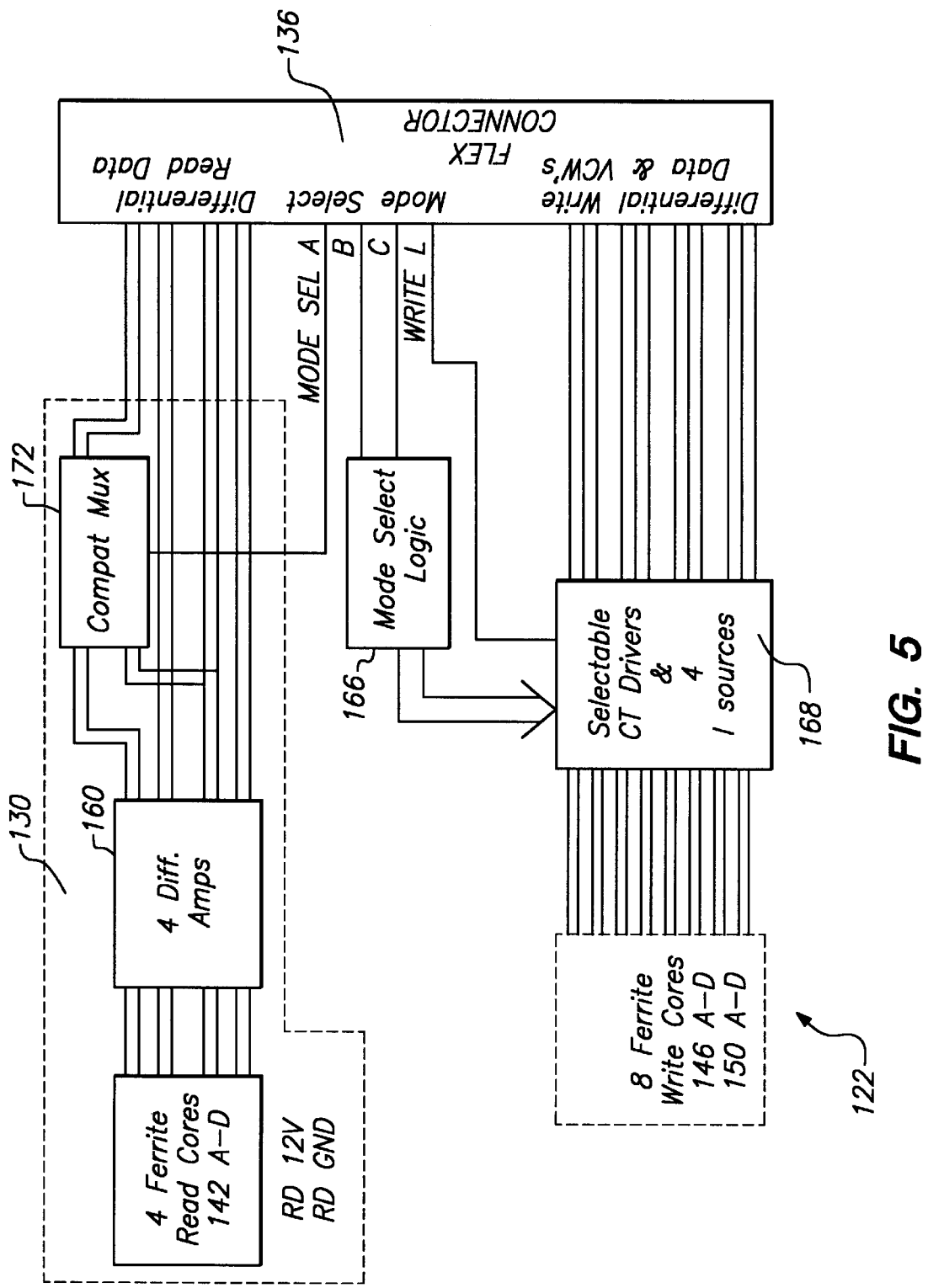
FIG. 5 is an electrical block diagram of the FIG. 2 flex circuit.

FIG. 5 provides an electrical block diagram of the flex circuit 122. Therein, the edge connector 136 is shown providing connections for four differential read data signal paths, four logic signal paths, and four differential write data paths. The four read data signal paths lead from the read channel portion 130 of the flex circuit, via the flexible dynamic portion 132 and main circuit portion 134. The four logical mode select signals include a mode select A signal for controlling a single-channel backward-compatibility multiplexer 172 located in the read channel portion, which selects heads 142A or 142C for earlier single-channel tape record formats, and which enables read heads 142A, 142B, 142C and 142D for four channel playback of azimuth angle record formats.

Mode select lines B, C and L control the mode select logic 166 such that four of eight write heads 146A–D or 150A–D are enabled during azimuthal bidirectional writing operations, while two of the eight write heads, e.g. heads 146B and 146D, or 150B and 150D, are enabled during longitudinal bidirectional writing operations. Not shown in the FIG. 5 block diagram, but present in the flex circuit 122 are appropriate power traces for supplying power to the various electronics elements carried on, and connected by, the flex circuit substrate.

Figure 6:
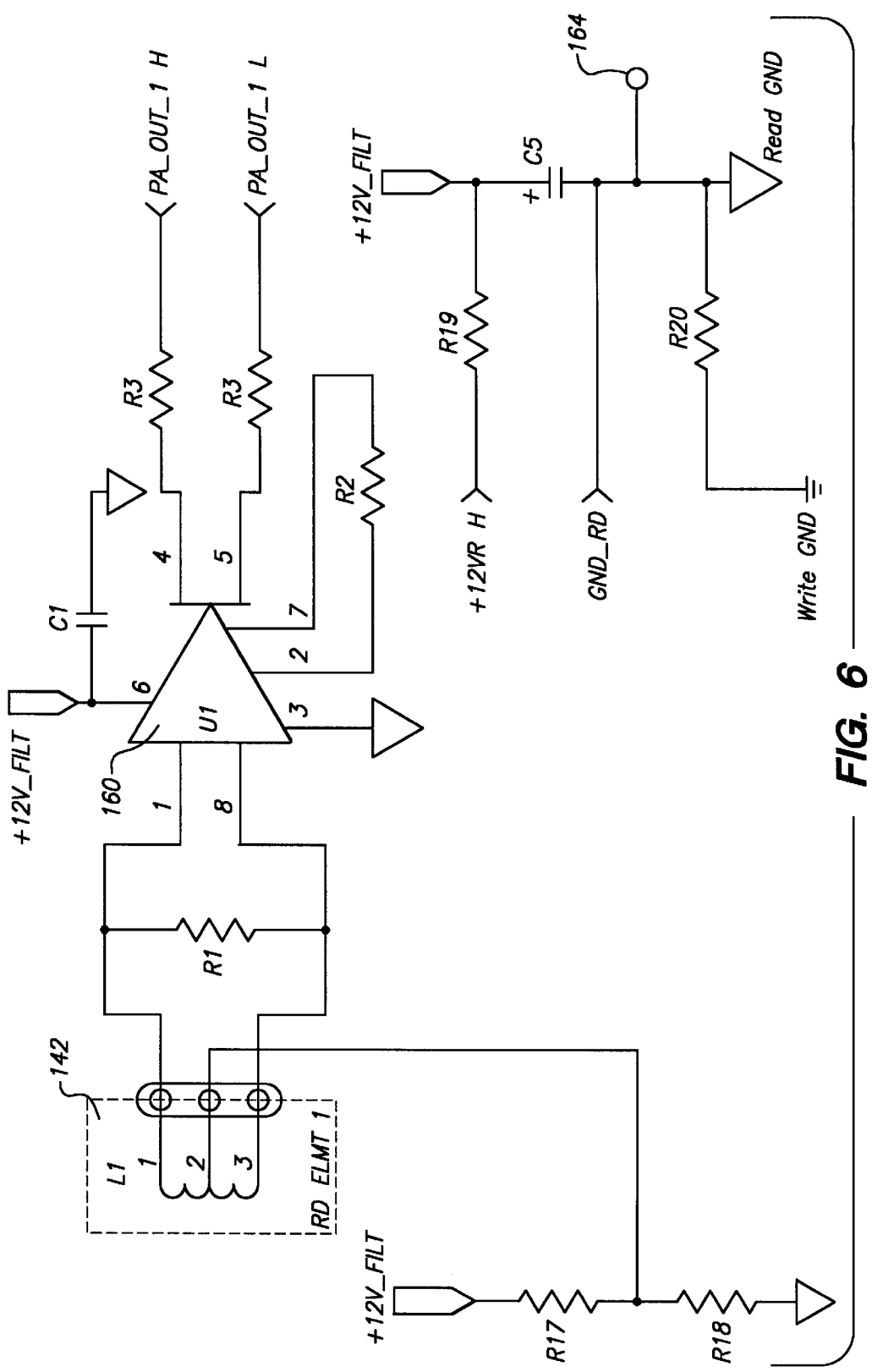
FIG. 6 an electrical schematic and block diagram of one read channel circuit within the FIG. 2 flex circuit.

FIG. 6 is a schematic circuit diagram of one of the four read preamplifier channel circuits carried on the read channel portion 130 of the flex circuit. Each channel includes a differentially connected operational amplifier 160, such as type TL592A, having power rails set at ground and at a +12 volt filtered DC levels. In this particular example each read head 142 includes a center tap connection which is connected to a voltage divider to provide amplifier bias current and to provide a common reference voltage, and thereby enable the amplifier 160 to operate in differential mode, thereby providing enhanced common mode noise rejection. Also, a ten ohm resistor and a 4.7 micro farad capacitor form a filter network for providing filtered 12 volt DC from a DC supply trace from the main electronics circuit module. This 12 volt DC filter located on the read channel portion 130 of the flex circuit 122 also provides a read signal single ground point at one of the screw openings 164, as previously noted.

Figure 7:
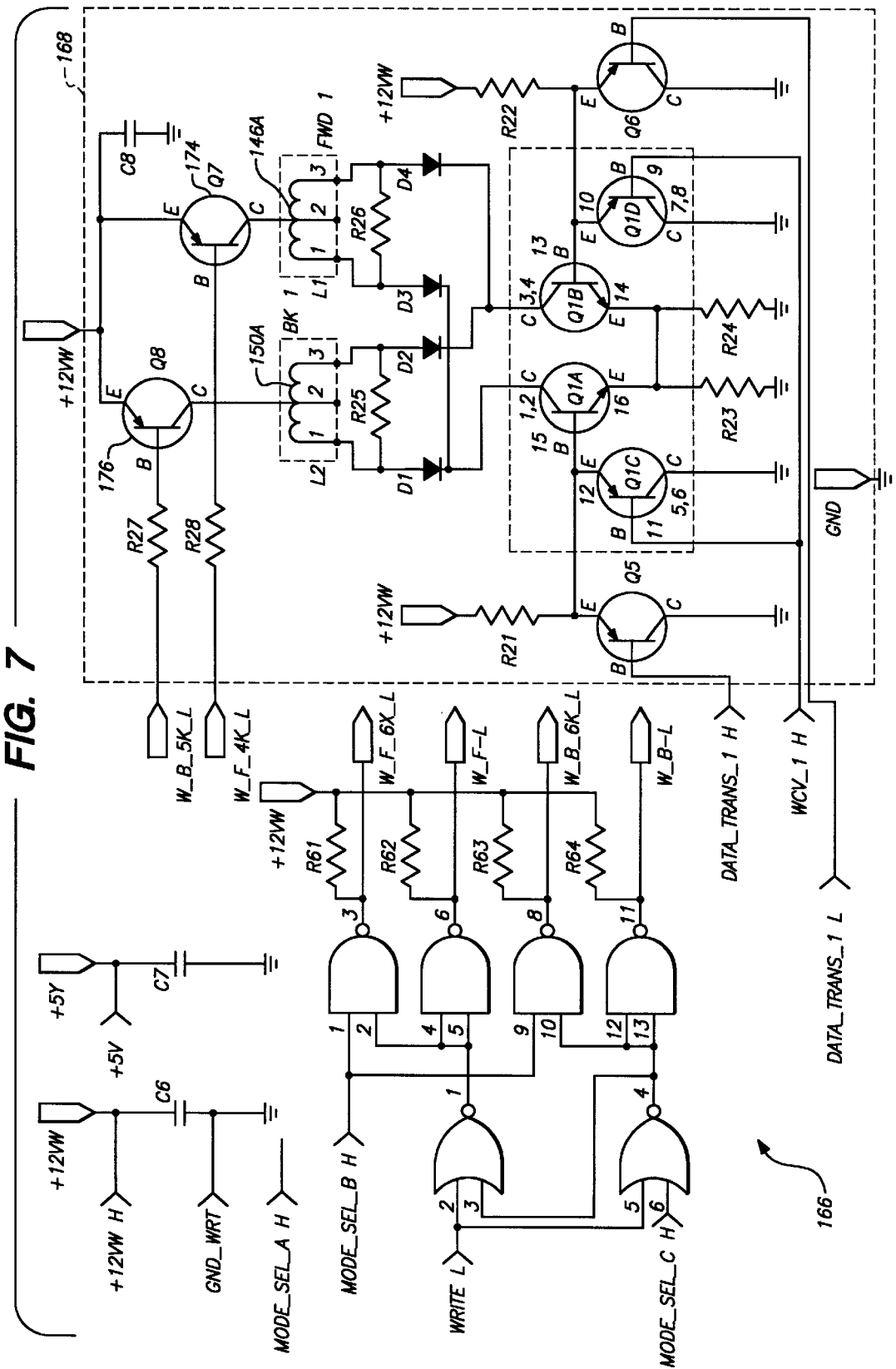
FIG. 7 is an electrical logic and schematic circuit diagram of head select logic and a forward/reverse head write channel driver circuit of the FIG. 2 flex circuit.

FIG. 7 illustrates the logic circuits comprising the mode select logic 166, and one of the four current source/write driver circuits 168 formed and connected on the main circuit portion 134 of the flex circuit 122. Each of the write drivers 168 includes circuitry for driving two of the eight write heads 146 and 150. In the example of FIG. 7, each one of heads 146A and 150 A are driven unidirectionally by three of six transistors forming dynamically and independently controlled current sources within each write channel driver circuit 168. In the FIG. 7 example one of the heads 146A or 150A is selected by a head select transistor connected to a head centertap. Transistor 174 selects head 146A, and transistor 176 selects head 150A. The transistors 174 and 176 are selectively enabled in accordance with control levels generated by the logic 166 in response to the incoming mode control signals B, C and L. So long as a +12 volt level is not present at the center tap of each head, it is effectively disconnected by diodes from the write driver circuitry. When either the transistor 174 or the transistor 176 is caused to conduct, 12 volts (less a voltage drop across the selected transistor 174 or 176) appears at the center tap of the selected head 146 or 150, and the current source completes a signal path through the head and the selected and conducting transistor, thereby energizing the selected write head in one current direction or another, and writing a desired magnetic flux pattern to the moving tape 114.

Figure 8:
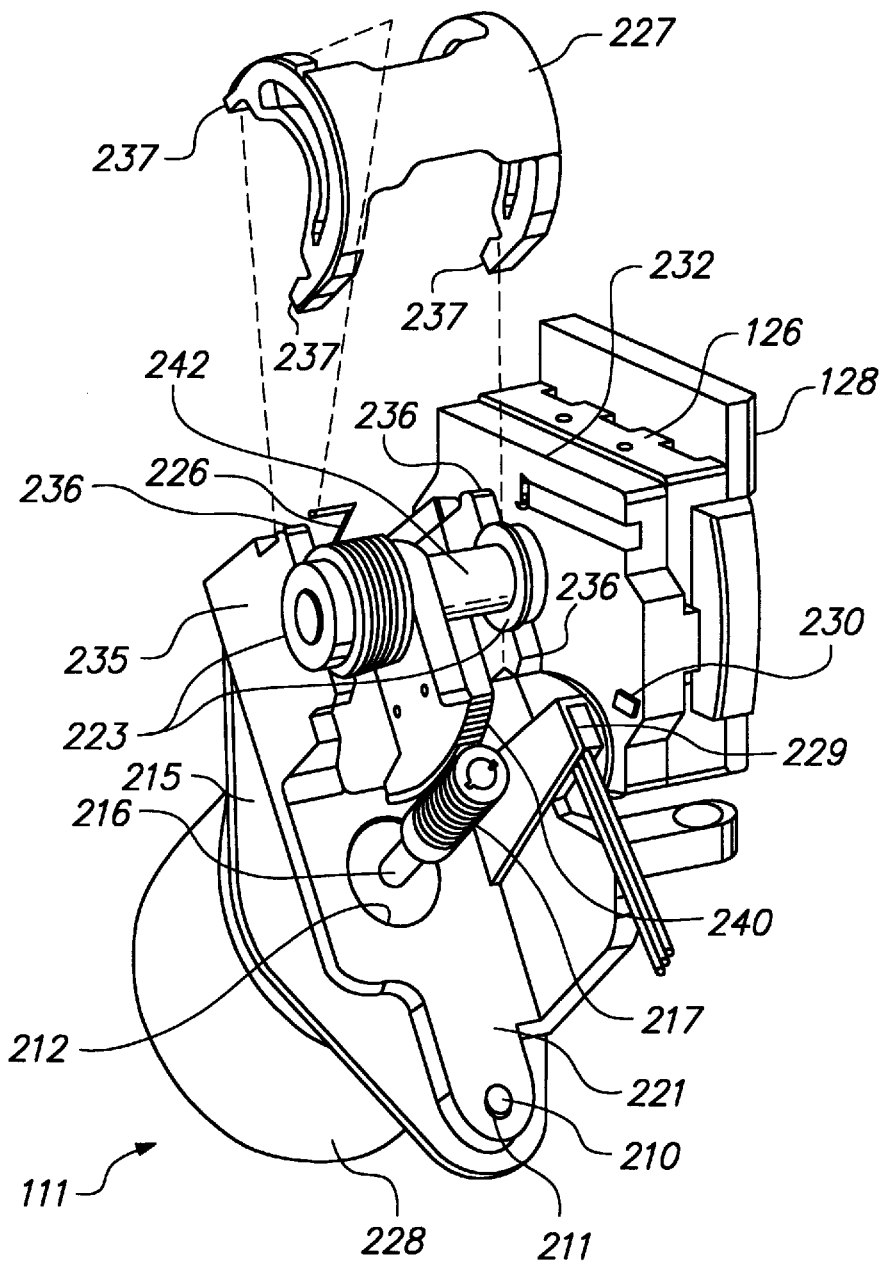
FIG. 8 is an isometric view of a preferred azimuth mechanism of the FIG. 3 flex circuit module.

FIG. 8 shows an exploded view of a preferred form of head tilting mechanism 111. The mechanism 111 includes a stepper motor assembly 228, including a motor flange 215, a rotating shaft 216, and a worm 217 attached at the end of the shaft 216. The motor assembly 228 is mounted to a bracket 221 such that the shaft 216 and worm 217 are inserted through a through hole 212 defined in the bracket 221. The motor 228 is secured to the bracket by set screws 210 which are inserted through aligned holes 211 in the motor flange 215 and the bracket 221.

Worm gear 240 is integrally attached to shaft 242, which is integrally connected to a receiver plate 232 to which the head plate 126 is secured. Worm gear 240 is meshably engaged to the worm 217 and transfers rotational movement from the stepper motor 228 to the magnetic head array 128. Bearings 223 are inserted at both ends of shaft 242 and support the shaft 242-worm gear 240 assembly in the supporting sections 235 of bracket 221.

A torsional spring 226 having one end coupled to the worm gear 240 and the other end coupled to a bearing cap 227, provides a loading force to bias the worm gear 240 into constant contact against the worm 217 to eliminate backlash. The use of one worm gear eliminates the need to use torsional springs on every gear in order to eliminate backlash in a gear box. Furthermore, the use of a single worm gear reduces the overall mass and moment of inertia of the gears, enabling a higher bandwidth.

As shown in FIG. 8, the bearing cap 227 is provided with four legs 237 which snap fit onto mounting tabs 236, formed in bracket 221, to secure the worm gear 240 and shaft 242 against the bracket 221. The bearing cap 227 may be made of plastic or other lightweight material.

Also shown in FIG. 8 is a Hall sensor 229 mounted to the bracket opposite head plate 232. The Hall sensor 229 senses a magnetic field from a small permanent magnet 230, attached to the receiver plate 232. As the head assembly rotates relative to the Hall sensor 229, the magnet 230 moves either closer or farther away from the sensor 229. At a predetermined proximity, the magnetic field from the magnet 230 triggers a "high" signal on the Hall sensor 229. Conversely, as the head rotates away from the sensor, outside the predetermined proximity, the sensor 229 will shift to a "low" signal. The predetermined proximity will depend on the strength of the magnet and the sensitivity of the sensor. Thus, the signal measured by the Hall sensor 229 provides a reference for determining the initial direction of rotation during tape drive power up.

Thus, it will be apparent to those skilled in the art that the flex circuit 122 and its associated electronics has resulted in a front end module for a tape drive in which read and write circuit components associated with a head structure have been located as close as practical to the head cores via a one-piece, two layer, flexible printed circuit which provides for both component mounting and flexible interconnection via edge connector 136 at one end to the main circuit board 138. At another end, the flex circuit mounts directly to a detachable head structure and connects to the read and write head core windings. Connections of these most sensitive signals are kept extremely short, are balanced and are carefully laid out to minimize exposure to noise. Noisy signals and their return paths are carefully planned and routed. There are no low-level or high impedance signals entering or leaving the flex circuit edge connector 136. As explained, all of the read preamplifiers, write current sources and drivers and write coil selection logic circuitry is included and fully contained on the flex circuit 122.

As described above, the flex circuit 122 enables four channels of simultaneous writing and reading with an unshielded flexible interconnect circuit, while minimizing both electrostatic and electromagnetic noise coupling. The flex circuit 122 reduces stray capacitance and increases electrical resonance frequency without sacrificing output levels or waveshapes.

The flex circuit 122 reduces and makes consistent the mechanical bias forces being applied to the head structure 120 and positioning mechanism 104. By employing a single dynamic flex portion 132, the flex circuit 122 provides for two-dimensional head movements: vertical stepping for track positioning, and rocking or tilting for azimuth recording. Both the vertical motion and the angular rocking motion are translated into a single rolling motion by the dynamic flexible portion 132, thereby reducing mechanical complexity and improving consistency and quality in the completed tape drive 100.

The flex circuit 122, when married structurally and electrically to the head plate 126 and attached head array 128, provides a self-contained tape head module enabling ready removal and replacement, as well as the use of different head technologies with a high degree of transparency to the host electronics and tape drive user. Since all of the circuitry directly associated with each head array is contained on the flex circuit 122, it is practical to have multiple head/circuit design combinations which are hardware-compatible at the interconnect 136 to the main circuit board 138 electronics. Thus, advancing head technologies, including thin film inductive elements, and inductive write/magnetoresistive read elements may be supported by appropriate circuitry on a flex circuit like the circuit 122 and thus be compatible without substantial hardware modification of the main circuit board of the tape drive.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A tape head for a drive, the drive including a head positioning mechanism and a circuit board, the tape head comprising:

a module which is adapted to be added to the drive as a single unit, the module including (i) a head plate adapted to be attached to the head positioning mechanism; (ii) a head array secured to the head plate, (iii) a flex circuit including a first portion, a second portion and a flexing portion, the first portion being electrically connected to the head array, the second portion including a connection region which is adapted to electrically connect to the circuit board to connect the head array to the circuit board, and the flexing portion being adapted to allow for movement of the first portion relative to the second portion; (iv) a plurality of read channel preamplifiers secured to the flex circuit and electrically connected to the head array, the plurality of read channel preamplifiers being adapted to receive and amplify read signals from a plurality of read heads in the head array, and (v) a plurality of write channel drivers secured to the flex circuit and electrically connected to the head array, the plurality of write channel drivers being adapted to selectively drive a plurality of write heads in the head array;

wherein the flexing portion separates the plurality of read channel preampifiers from the plurality of write channel drivers;

wherein the flex circuit includes mechanical reinforcement means for mechanically stiffening and reinforcing the flex circuit where the read channel preamplifiers are secured to protect the read channel preamplifiers; and wherein the flex circuit includes mechanical reinforcement means for mechanically stiffening and reinforcing the flex circuit where the write channel drivers are secured to protect the write channel drivers.

2. The tape head of claim 1 further comprising head selection logic circuitry secured to the flex circuit, the head logic circuitry being adapted to select and enable the write heads in response to positional adjustments made to the head array.

3. The tape head of claim 1 wherein the write heads and the read heads of the head array are electrically connected to the flex circuit along a connection edge of the first portion.

4. The tape head of claim 1 wherein the head array includes at least four forward direction write heads, at least four reverse direction write heads and at least four read heads located between the forward direction write heads and the reverse direction write heads.

5. A tape drive including the tape head of claim 1.

6. The tape drive of claim 5 comprising the circuit board and the head positioning mechanism which includes a receiver plate which moves relative to the circuit board; wherein the head plate includes a pair of side tabs which engage the receiver plate to precisely and detachably secure the head plate to the receiver plate; and wherein the connection region of the second portion of the flex circuit is adapted to plug into the circuit board to electrically connect the head array to the circuit board.

7. The tape drive of claim 5 including the head positioning mechanism which is adapted to position the head array at a plurality of predetermined azimuth angles and to move the head array in an elevational direction generally perpendicular a base of the tape drive.

8. The tape drive of claim 7 wherein the flexing portion is generally U-shaped when the flex circuit is installed in the tape drive so that the flexing portion allows for the motion of the head array at the plurality of predetermined azimuth angles and generally perpendicular the base of the tape drive.

9. A tape head for a tape drive, the tape drive including a head positioning mechanism, a base and a circuit board attached to the base, the head positioning mechanism including a receiver plate which moves relative to the base, the head positioning mechanism being adapted to position the receiver plate at plural predetermined azimuth angles and to move the receiver plate in an elevational direction generally perpendicular the base of the tape drive, the tape head comprising:

a module which is adapted to be added to the tape drive as a single unit, the module including:
a head plate adapted to be detachably secured to the receiver plate;
a head array secured to the head plate, the head array including a plurality of read heads and a plurality of write heads; and
a flex circuit including (i) a first portion attached to the head plate and electrically connected to the head array, (ii) a second portion including a connection region which is adapted to plug into the circuit board, (iii) a flexing portion positioned between the first portion and the second portion, the flexing portion being adapted to allow for movement of the first portion relative to the second portion, (iv) a plurality of read channel preamplifiers secured to the first portion, the read channel preamplifiers being adapted to receive and amplify read signals from the read heads, (v) a plurality of write channel drivers secured to the second portion, the write channel drivers being adapted for selectively driving the write heads, (vi) first mechanical reinforcement means for mechanically stiffening and reinforcing the first portion to protect the read channel preamplifiers and (vii) second mechanical reinforcement means for mechanically stiffening and reinforcing the second portion to protect the write channel drivers.

10. A tape head of claim 9 wherein the head plate includes a pair of side tabs for precisely and detachably securing the head plate to the receiver plate.

11. The tape drive of claim 9 wherein the first portion includes a plurality of trace circuit connections formed along a connection edge of the first portion, for electrically connecting the head array to the flex circuit.

12. A method for manufacturing a tape head module which is adapted to be added to a tape drive as a single unit, the tape drive including a head positioning mechanism and a circuit board, the method comprising the steps of:

providing a head plate adapted to be selectively attached to the head positioning mechanism;
providing a head array;
providing a flex circuit including a first portion, a second portion, and a flexing portion positioned between the first portion and the second portion, the second portion including a connection region which is adapted to plug into the circuit board of the tape drive and the flexing portion being adapted to allow for movement of the first portion relative to the second portion;
securing a plurality of read channel preamplifiers to the first portion of the flex circuit;
securing a plurality of write channel drivers to the second portion of the flex circuit;
mechanically stiffening and reinforcing the flex circuit where the read channel preamplifiers are secured to protect the read channel preamplifiers;
mechanically stiffening and reinforcing the flex circuit where the write channel drivers are secured to protect the write channel drivers; and
attaching the head array and the first portion of the flex circuit to the head plate to form the tape head module which can be added as a single unit to the tape drive.

13. The method of claim 12 including the step of testing the tape head module prior to installing the tape head module into the tape drive.

14. The method of claim 12 wherein the step of attaching the head array and the first portion includes the step of electrically connecting a connection edge of the first portion of the flex circuit to the head array.

* * * * *